United States Patent [19]

Frerking

[11] 4,297,657
[45] Oct. 27, 1981

[54] CLOSED LOOP TEMPERATURE COMPENSATED FREQUENCY REFERENCE

[75] Inventor: Marvin E. Frerking, Cedar Rapids, Iowa

[73] Assignee: Rockwell International Corporation, El Segundo, Calif.

[21] Appl. No.: 88,908

[22] Filed: Oct. 29, 1979

[51] Int. Cl.³ .............................................. H03L 1/02
[52] U.S. Cl. ...................................... 331/176; 331/66
[58] Field of Search .................... 331/176, 116 R, 66, 331/47

[56] References Cited

U.S. PATENT DOCUMENTS

| | | | |
|---|---|---|---|
| 3,713,033 | 1/1973 | Frerking | 331/176 X |
| 3,719,838 | 3/1973 | Peduto et al. | 331/176 X |

Primary Examiner—Siegfried H. Grimm
Assistant Examiner—Edward P. Westin
Attorney, Agent, or Firm—Richard K. Robinson; Howard R. Greenberg; H. Fredrick Hamann

[57] ABSTRACT

An oscillator is temperature compensated by adjusting a slave oscillator with an error signal, that is produced by using the temperature of a reference oscillator to determine the frequency error of the reference oscillator, and then adjusting the frequency of the slave oscillator until its frequency coincides with an ambient reference frequency.

6 Claims, 4 Drawing Figures

CLOSED LOOP TEMPERATURE COMPENSATED FREQUENCY REFERENCE

The Government has rights in this invention pursuant to Contract No. DAAB07-78-C-0160 awared by the Department of the Army.

BACKGROUND OF THE INVENTION

The invention relates to a temperature compensated ocillator.

Temperature compensation of an oscillator, such as a crystal oscillator, normally involves measuring the temperature of the crystal, determining the frequency error of the crystal at the temperature which involves complicated circuitry, and then applying a correction to a control signal which pulls the oscillator back on frequency. Many errors arise when this type of oscillator is used because crystal oscillators which can be adjusted require external components such as variable capacitors. Because of the type of crystal which is normally used in this type of circuit, there are accelerated aging rates of the crystals as well as frequency hysteresis effects which must also be compensated for.

SUMMARY OF THE INVENTION

An oscillator is temperature compensated by adjusting a slave oscillator with an error signal that is produced by using the temperature of a reference oscillator to determine the frequency error of the reference oscillator, and then adjusting the frequency of the slave oscillator until its frequency coincides with an ambient reference frequency.

A variable oscillator is used to generate the desired frequency and is controlled by an error signal. The error signal is periodically applied to the slave oscillator by producing a beat frequency from the comparison of the slave oscillator frequency with a reference frequency. When the comparison between the two frequencies exceeds a predetermined level, the error signal is applied to the slave oscillator to pull the slave oscillator back on frequency. The error signal is generated from a lookup table, that has stored within the error signal generator, frequency correction for the reference oscillator at the temperature at which the reference oscillator is operating.

The invention may be implemented with current solid state digital logic circuits or even more preferably with microprocessors.

BRIEF DESCRIPTION OF THE DRAWINGS

The invention is illustrated in the accompanying drawings wherein.

DETAILED DESCRIPTION OF THE PREFERRED EMBODIMENT

Figure 1:
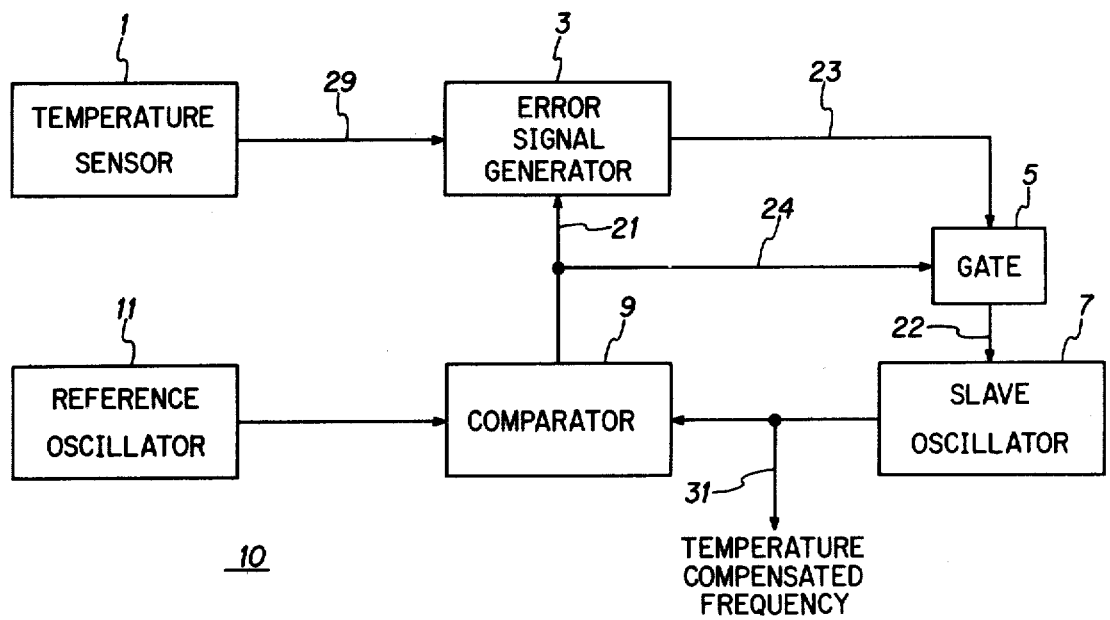
FIG. 1 is a block diagram of a temperature compensated oscillator according to the invention.

A block diagram of the invention is shown in FIG. 1, to which reference should now be made. There is a slave oscillator 7 which provides the temperature compensated frequency on conductor 31, and also to a comparator 9. The comparator 9 compares the output frequency from the slave oscillator with the output frequency of a reference oscillator 11 and when the comparison indicates that there is a difference between the two frequencies of a predetermined or selected level, a correcting signal is applied to the slave oscillator by connection 22. The correcting signal is provided by the error signal generator 3 which has stored within the correcting factors of the reference oscillator 11 at different temperatures. The temperature sensor 1 provides a measure of the temperature of the reference oscillator in digital form. The actual sensor may be an analog device such as a thermistor or thermocouple followed by an A/D converter, or it may be an oscillator whose frequency changes very rapidly with temperature followed by a frequency counter. In any event, the error signal generator is provided with the measured temperature, preferably in digital form. The error signal generator uses the temperature reading along with prestored information about the frequency of the reference oscillator 11 versus temperature behavior of the crystal of the reference oscillator 11 to determine the expected frequency of the reference oscillator 11 at that measured temperature. As mentioned earlier, the error signal generator then provides a correcting factor to the slave oscillator by way of the gate 5. Corrections are made periodically, so that if a digital-to-analog converter is used or the slave oscillator does not perform the correction exactly, the error will be found in the next frequency comparison, and a refined correction made.

It should be noted that the slave oscillator 7 may be an oscillator such as a voltage controlled oscillator which responds to an analog signal or a digital format by providing a multiplicity of switching tuning elements in the oscillators with a weighted or binary scale sensitivity.

Since the reference oscillator's frequency need not be electrically pullable, the voltage variable capacitor that is normally associated with the circuit is eliminated. This significantly reduces the susceptibility of the reference oscillator 11 to changes in the power supply voltage and thus improves its frequency stability. A greater advantage in using this type of circuit results, however, because a much stiffer crystal (electrically harder to pull) can be used in the reference oscillators, such as a third or fifth overtone crystal. Such crystals tend to have improved aging rates as well as smaller frequency hysteresis effects.

The error signal generator 3 is preloaded with the frequency from the comparator 9, or an adjusted factor from the reference oscillator 11 by storing the information by way of switch 13 (see FIG. 2) within the error signal generator at different temperatures as indicated by the temperature sensor 1. One advantage of this type of circuitry, in the event that there is aging or initial calibration error, is the correction table within the error signal generator will be adjusted to compensate for the aging factor.

Figure 2:
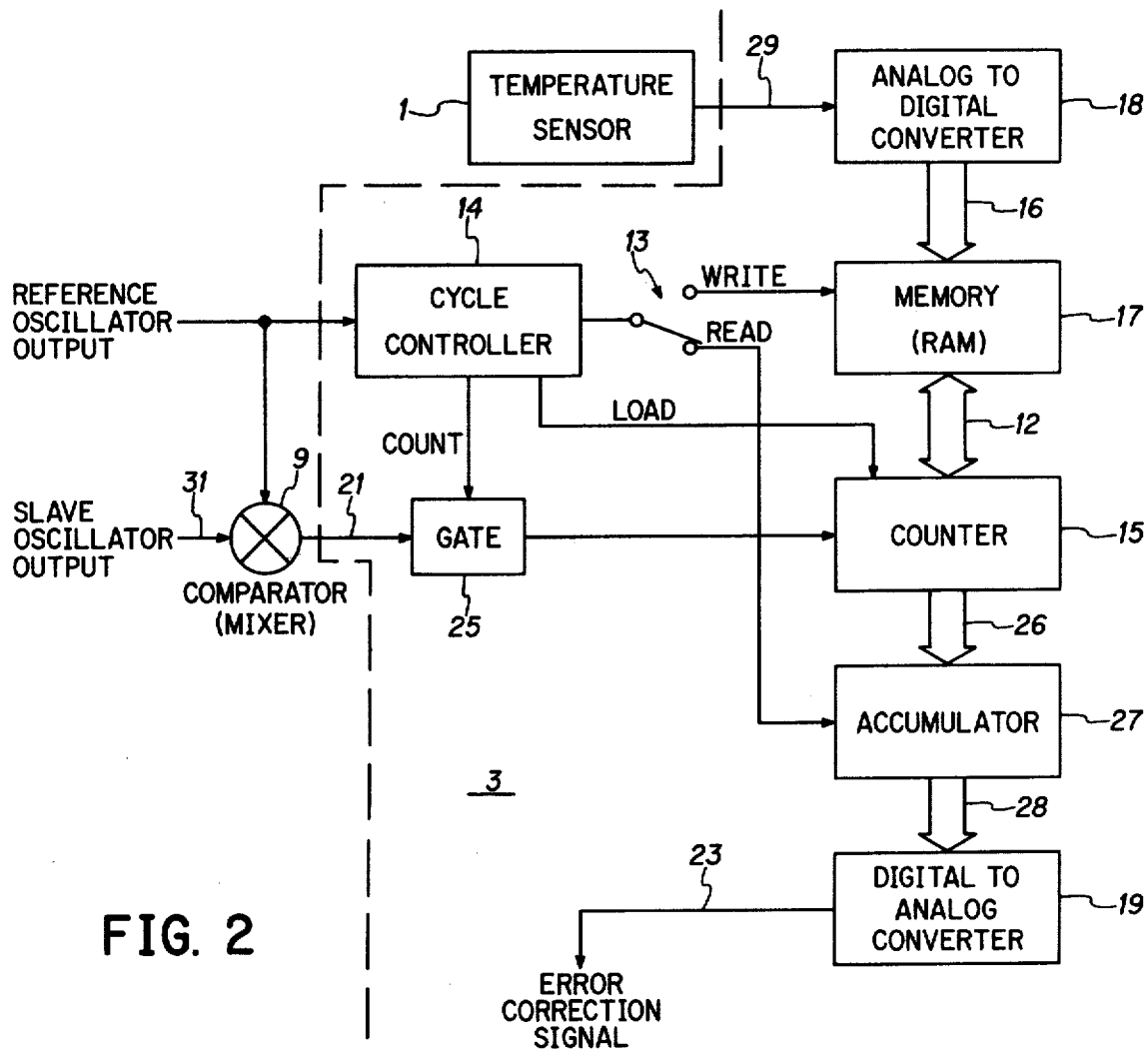
FIG. 2 is a block diagram of an error signal generator that can be used with the embodiment of FIG. 1.

An embodiment of the error signal generator is shown in FIG. 2 in which there is a temperature sensor 1 provides an analog indication of the temperature on conductor 29 that is converted to a digital format by analog-to-digital converter 18. The digital information is used to address the data that is stored within the memory 17. The cycle controller 14 controls the loading of data into the counter 15, as well as the loading and unloading of the memory unit 17. The counter 15 accepts the digital information from the memory. The cycle controller 14 then opens gate 25 and allows the counter to count down for a predetermined time. After the count period, the residual number in the counter 15 provides a correction value for the accumulator 27, or if the counter 15 reaches zero, the remaining input pulses decrement the accumulator. The accumulator 27 now has stored therein the correcting factors for the slave oscillator 7 at the measured temperature, and provides the correction factor on data bus 28, which is connected to digital-to-analog converter 19. The digital-to-analog converter 19 converts the digital information from the accumulator 27 into an analog format and provides this information on conductor 23, which as shown in FIG. 1 at the closing of gate 5, is conducted to the slave oscillator 7.

The lookup table of the memory 17 is initially loaded or updated by storing the beat frequency into the memory 17 for different temperatures as measured by the temperature sensor 1.

If the compensate/operate switch 13 is in the compensate mode (write position), and an external reference signal is used to replace the slave oscillator output on conductor 31 the output from the counter 15 is loaded into the memory or Ram 17 by way of bus 12 rather than in the accumulator 27. In this mode, the counter is initially reset to zero rather than to an initial value, and counts up. The accumulated count when gate 25 is closed then represents the correction value which must be stored in memory 17 for the operate mode at that existing temperature.

Figure 3:
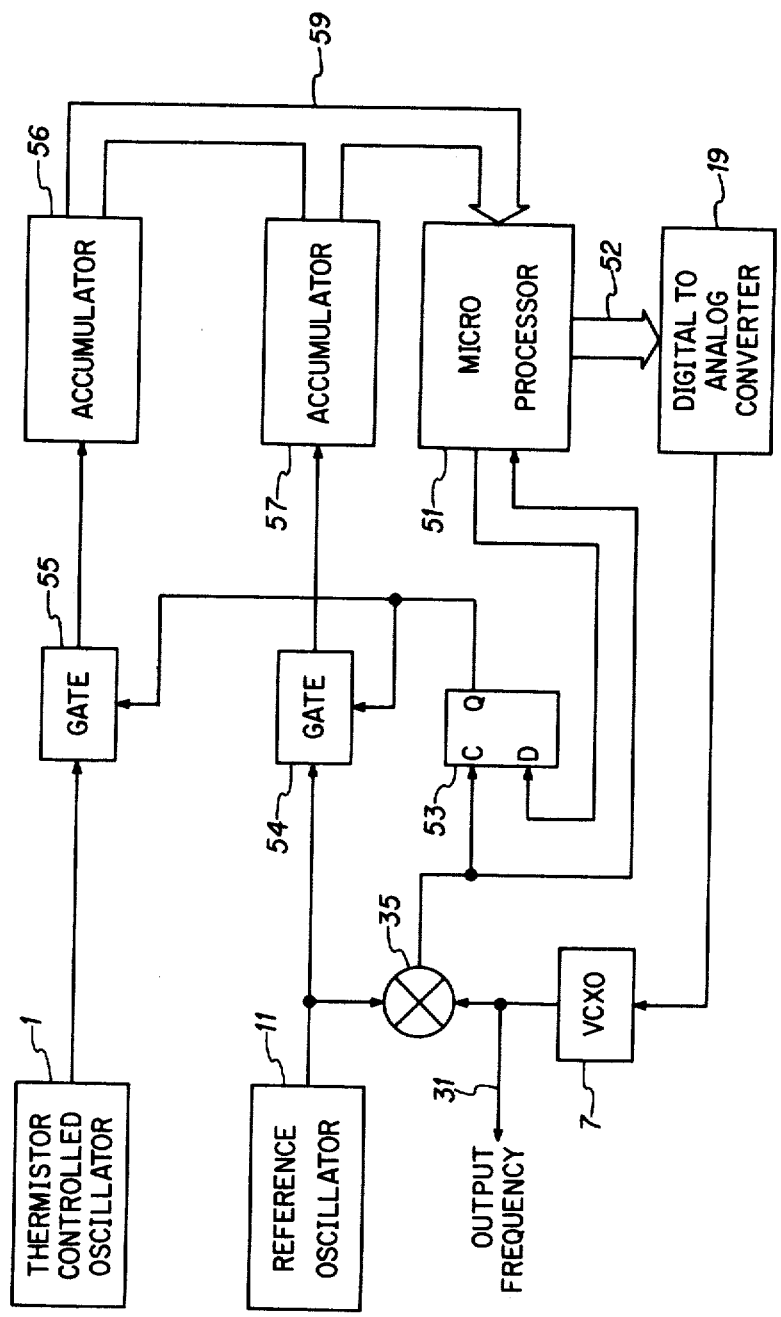
FIG. 3 is an embodiment of the temperature compensated oscillator that utilizes a microprocessor.

In FIG. 3, there is provided a more sophisticated embodiment of the invention, in which there is used a microprocessor 51 for providing the memory and error signal generator functions. There is a thermistor controlled oscillator 1 which measures the temperature of the reference oscillator 11 and provides a frequency, proportional to temperature, to the input of the gate 55. When the gate 55 closes, the accumulated value in the accumulator 56 is available for processing by microprocessor 51. The reference oscillator 11 provides the output reference frequency to mixer 35 and also to gate 54. On the closing of gate 54, the reference frequency is accumulated by accumulator 57 and later, by way of data bus 59, is used by the microprocessor 51 to make the appropriate frequency corrections to the voltage controlled crystal oscillator (VCXO) 7 which is, of course, the slave oscillator of FIG. 1. The voltage controlled crystal oscillator (VCXO) 7 provides its output frequency on conductor 31 and also to mixer means 35 where the beat frequency is used to clock the D flip-flop 53 which then energizes the gates 54 and 55, as well as cueing the microprocessor 51 to generate the error correction signal. The error correction signal is provided on the output data bus 52 of the microprocessor 51, which is connected to a digital-to-analog converter 19. The digital-to-analog converter 19 converts the digital information from the microprocessor 51 into an analog format and uses the analog signal to control the output frequency of the voltage controlled crystal oscillator 7.

Figure 4:
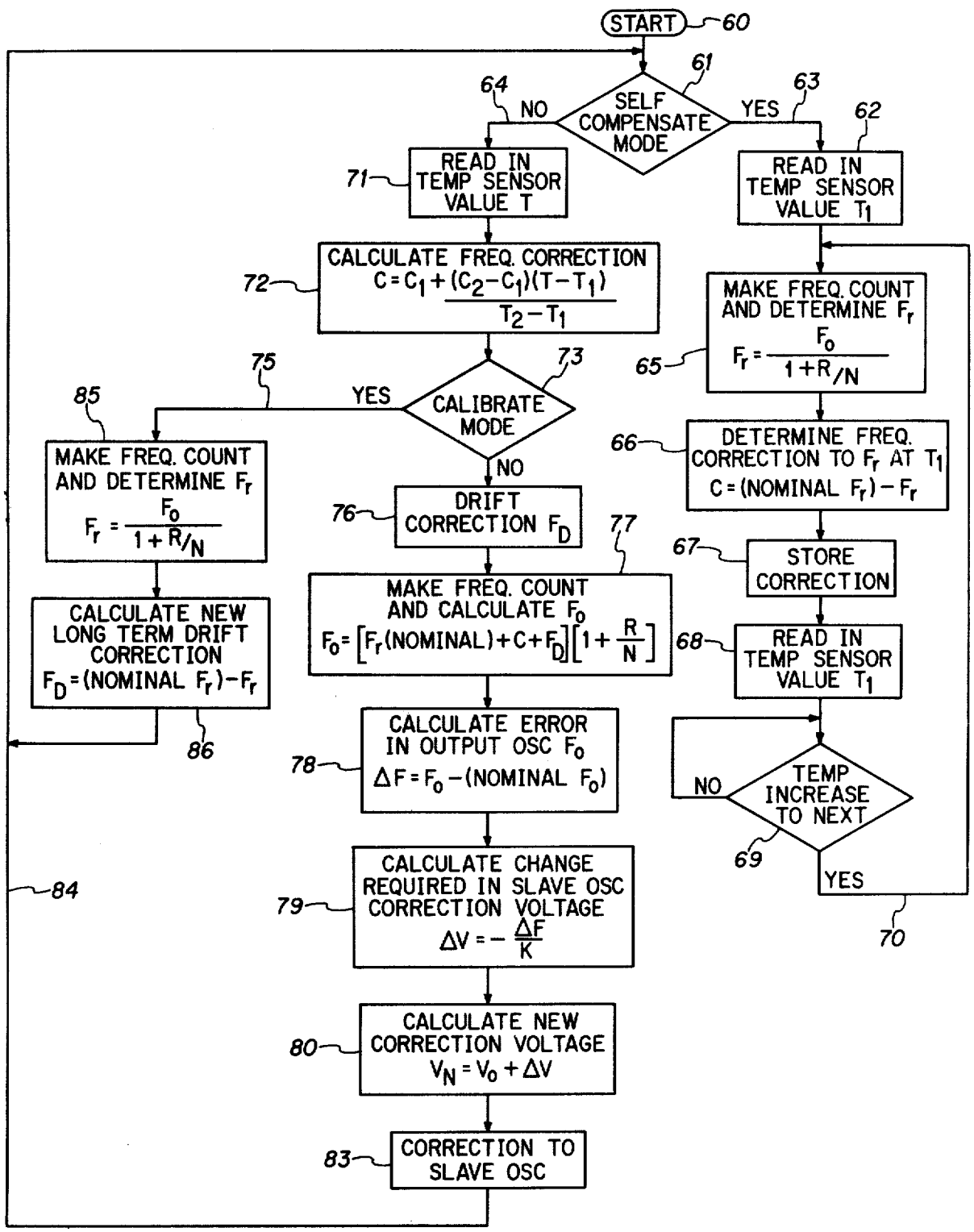
FIG. 4 is a flow diagram of the functions performed by the temperature compensated oscillator circuits.

For a better understanding of the operation of the invention, there is provided a flow diagram in FIG. 4 of embodiments represented in the block diagrams of FIGS. 1 and 3. The system is initialized at the start point 60 and the first decision block decides if the unit is to operate in the self-compensated mode.

A unique feature of the invention is that the capability exists for the unit to build its own compensation table in the RAM. This is accomplished by replacing the slave oscillator with an external signal of the desired slave frequency. With this signal applied and the compensate/operate switch in the compensate mode, the unit is exposed to the specified range of ambient temperatures.

If the answer is yes, then loop 63 is taken and the first step at the block 62 is to read-in the temperature from the temperature sensor 1 and assign it the value of $T_1$. Since the gate period for counting is variable, the ratio of the value in accumulator 56 to the value in accumulator 57 is used to represent temperature. The second step (block 65) is to make a frequency count and determine the reference frequency $F_r$, where $F_r$ is equal to $F_o/(1+R/N)$. $F_o$ being the normalized frequency of the oscillator, R is the number of beat frequency cycles that the counter has accumulated. The next step (block 66) is to determine the correction C to $F_r$ at temperature $T_1$. The correction C is equal to (Nominal $F_r$)−$F_r$. The next step is to store the correction at block 67, after which the temperature is again sampled. There is a comparison made to see if there has been an increase in temperature. If no increase, then the system loops on itself until there is a temperature increase. This decision occurs at decision block 69. If there is a temperature increase, then loop 70 returns back to the beginning of step 65, which is represented by block 65. Corrections at subsequent temperatures $T_2$, $T_3$ $T_n$ are assigned values $C_2$, $C_3$−$C_n$, thus building a table of temperature-correction pairs. The second loop, if the oscillator is not operating in the self-compensate mode, is loop 64 where the first step at block 71 is to read-in the temperature T from the sensor. At block 72, the next step is to calculate the correction to the frequency of the reference oscillator $F_r$ at the temperature T. This correction C is equal to $C_1$ plus $(C_2-C_1)/(T_2-T_1)\cdot(T-T_1)$ where $C_1$ represents the nearest stored correction at temperature $T_1$ below T and $C_2$ represents the nearest stored correction at temperature $T_2$ above T. Decision block 73 determines if there is calibration to be made. If there is no calibration to be made, then the next step of the diagram of FIG. 4 is used and there is a drift correction $F_D$ available to determine the drift correction factor $F_D$ at block 76. At block 77, a calculation is made to determine the frequency of the slave oscillator. $F_o$=(Nominal $F_r$)+C, as shown in block 77, the correction for temperature+$F_D$ the drift frequency $\times 1+(R/N)$ where (R/N) again has the previously indicated value. Block 78 is to calculate the error in the output oscillator $F_o$, that is $\Delta F=F_o-$(Nominal $F_o$). At block 79, the change required in the slave oscillator correction voltage 7 is calculated, which is $\Delta V$, in the event there is a VCXO,=$\Delta F$ as calculated at block 79, divided by a constant which is dependent upon the circuit parameter of the voltage controlled oscillator. At block 80, the step is to calculate new correction voltage $V_N$-$V_N$.=$V_o$+$\Delta V$ where $V_o$ is the previous correction voltage and $\Delta V$ is the voltage that was calculated at block 79. In block 83, the step is to correct the slave oscillator 7 at which point the circuit returns to the beginning of decision block 61.

Returning to decision block 73, if there is a decision to go into the calibrate mode, then loop 75 is taken, in which case, at block 85, the circuit makes a frequency count and determines $F_r$, where $F_r=F_o/(1+R/N)$. After $F_r$ has been calculated, the next step would be to calculate the new long term drift correction which is $F_D$ as represented by the equation $F_D =$ (Nominal $F_r) - F_r$. This operation is performed in block 86. At the completion of this block, the loop returns to the beginning of decision block 61.

Although the invention has been described and illustrated with a certain degree of particularity, it is understood that numerous changes in the arrangements and combination of parts may be resorted to without departing from the spirit and scope of the invention as hereinafter claimed.

I claim:

1. A closed loop temperature compensated frequency reference, comprising:

controllable oscillator means for generating a first frequency;

reference oscillator means for generating a second frequency;

comparator means for comparing the first frequency means with the second frequency means to obtain a composite signal;

sensor means for measuring the temperature of the reference oscillator means and to provide a temperature signal representative of the measured temperature; and error signal generator means for generating a control signal to control the controllable oscillator means and the first frequency thereby, the control signal being generated by error signal generator means in response to the composite signal and the temperature signal.

2. The closed loop temperature compensated frequency reference according to claim 1, wherein the error signal generator means comprises:

converter means for converting the temperature signal into a reference composite signal and includes a memory which is addressable by the temperature signal and having stored therein according to different temperature signals, reference composite signals that result from the mixing of the second frequency with a reference frequency at measured temperatures as represented by the different temperature signals;

control signal generator means for generating the control signal from a comparison between the composite signal and the reference composite signal and includes a counter, means for loading the counter with the reference composite signal, gate means for passing the composite signal to the counter for a predetermined time period where the composite signal decrements the counter for the predetermined time period; and accumulator means for providing the control signal that corresponds to a remainder in the counter at the expiration of the predetermined time period.

3. A closed loop temperature compensated frequency reference according to claim 1, wherein the sensor means comprises:

a thermistor mounted in close thermal proximity to the means for generating the second frequency; and means for digitizing the output of the thermistor.

4. The closed loop temperature compensated frequency reference according to claim 3, wherein the sensor means comprises:

a crystal oscillator whose frequency changes at a known rate with temperature.

5. The closed loop temperature compensated frequency reference according to claim 1, wherein the controllable oscillator means comprises:

a variable frequency oscillator.

6. A method for temperature compensating a frequency reference, comprising:

generating a first frequency;

generating a second frequency mixing the first frequency with the second frequency to obtain a composite signal;

measuring the temperature at which the second frequency is generated; and obtaining a controlling signal from the temperature and the composite signal and adjusting the first frequency with the controlling signal.

* * * * *